(12) United States Patent
Sasaki et al.

(10) Patent No.: US 8,481,337 B2
(45) Date of Patent: Jul. 9, 2013

(54) MANUFACTURING METHOD OF SILICON SPIN TRANSPORT DEVICE AND SILICON SPIN TRANSPORT DEVICE

(75) Inventors: Tomoyuki Sasaki, Tokyo (JP); Tohru Oikawa, Tokyo (JP); Katsumichi Tagami, Saku (JP)

(73) Assignee: TDK Corporation, Tokyo (JP)

( * ) Notice: Subject to any disclaimer, the term of this patent is extended or adjusted under 35 U.S.C. 154(b) by 375 days.

(21) Appl. No.: 12/690,566

(22) Filed: Jan. 20, 2010

(65) Prior Publication Data
US 2010/0213519 A1    Aug. 26, 2010

(30) Foreign Application Priority Data

Feb. 25, 2009    (JP) .................................. 2009-042906

(51) Int. Cl.
*H01L 43/00*    (2006.01)
(52) U.S. Cl.
USPC ............... 438/3; 257/295; 257/491; 365/145
(58) Field of Classification Search
USPC ................................ 257/295; 438/3, 745, 753
See application file for complete search history.

(56) References Cited

U.S. PATENT DOCUMENTS

| | | | |
|---|---|---|---|
| 6,919,608 B2 | 7/2005 | Gregg | |
| 6,946,350 B2 * | 9/2005 | Lindert et al. | 438/285 |
| 7,209,328 B2 | 4/2007 | Ito et al. | |
| 7,583,482 B2 * | 9/2009 | Sbiaa et al. | 360/324.12 |
| 7,602,636 B2 * | 10/2009 | Saito et al. | 365/158 |
| 7,682,840 B2 * | 3/2010 | Hiebert et al. | 438/3 |
| 7,696,569 B2 * | 4/2010 | Fujimoto et al. | 257/330 |
| 7,742,328 B2 * | 6/2010 | Chen et al. | 365/158 |
| 7,851,313 B1 * | 12/2010 | Luo et al. | 438/285 |
| 7,969,692 B2 | 6/2011 | Takahashi | |
| 2005/0068698 A1 * | 3/2005 | Sato et al. | 360/324.12 |
| 2005/0141147 A1 * | 6/2005 | Sbiaa et al. | 360/324.2 |
| 2005/0142768 A1 * | 6/2005 | Lindert et al. | 438/285 |
| 2006/0022220 A1 | 2/2006 | Inomata et al. | |
| 2006/0057794 A1 * | 3/2006 | Youn et al. | 438/197 |
| 2006/0124978 A1 * | 6/2006 | Fontana et al. | 257/295 |
| 2006/0273356 A1 * | 12/2006 | Matsumoto et al. | 257/253 |

(Continued)

FOREIGN PATENT DOCUMENTS

| | | |
|---|---|---|
| JP | B-45-017988 | 6/1970 |
| JP | 06163511 A * | 6/1994 |

(Continued)

OTHER PUBLICATIONS

Van't Erve et al.; "Electrical injection and detection of spin-polarized carriers in silicon in a lateral transport geometry;" *Applied Physics Letters*; 2007; pp. 212109-1-212109-3; vol. 91.

(Continued)

*Primary Examiner* — Cheung Lee
*Assistant Examiner* — William Harriston
(74) *Attorney, Agent, or Firm* — Oliff & Berridge, PLC

(57) ABSTRACT

An object of the present invention is to provide a silicon spin transport device manufacturing method and silicon spin transport device whereby improved voltage output characteristics can be obtained. The silicon spin transport device manufacturing method comprises: a first step of patterning a silicon film by wet etching and forming a silicon channel layer; and a second step of forming a magnetization free layer and a magnetization fixed layer, which are apart from each other, on the silicon channel layer.

12 Claims, 13 Drawing Sheets

U.S. PATENT DOCUMENTS

| | | | |
|---|---|---|---|
| 2008/0017843 A1* | 1/2008 | Kaushal et al. | 257/14 |
| 2008/0124874 A1* | 5/2008 | Park et al. | 438/285 |
| 2008/0152952 A1* | 6/2008 | Santos et al. | 428/811.1 |
| 2009/0008689 A1* | 1/2009 | Koo et al. | 257/295 |
| 2009/0059659 A1* | 3/2009 | Inokuchi et al. | 365/171 |
| 2009/0146233 A1* | 6/2009 | Hall et al. | 257/427 |
| 2010/0019239 A1* | 1/2010 | Cheong et al. | 257/43 |
| 2010/0033880 A1* | 2/2010 | Dimitrov et al. | 360/324.1 |
| 2010/0176428 A1* | 7/2010 | Hong et al. | 257/295 |
| 2010/0200899 A1* | 8/2010 | Marukame et al. | 257/295 |
| 2010/0213519 A1* | 8/2010 | Sasaki et al. | 257/295 |
| 2011/0228596 A1* | 9/2011 | Inokuchi et al. | 365/158 |
| 2012/0020148 A1* | 1/2012 | Dimitrov | 365/158 |

FOREIGN PATENT DOCUMENTS

| | | |
|---|---|---|
| JP | A-06-163511 | 6/1994 |
| JP | A-2003-526939 | 9/2003 |
| JP | A-2004-186274 | 7/2004 |
| JP | A-2005-159273 | 6/2005 |
| JP | A-2007-299467 | 11/2007 |
| JP | B2-4029772 | 1/2008 |

OTHER PUBLICATIONS

Sasaki et al.; "Electrical Spin Injection into Silicon Using MgO Tunnel Barrier;" *Applied Physics Express*; 2009; pp. 053003-1-053003-3; vol. 2.

Translation of Jul. 3, 2012 Office Action issued in Japanese Patent Application No. P2009-042906.

Hyuk-Jae Jang et al.; "Non-ohmic spin transport in n-type doped silicon;" Physical Review B; 2008; pp. 165329-1-165329-6; vol. 78.

Tae-Suk Kim et al.; "Effect of ferromagnetic contacts on spin accumulation in an all-metallic lateral spin-valve system: Semiclassical spin drift-diffusion equations;" Physical Review B; 2008; pp. 214421-1-214421-12; vol. 78.

Tae-Suk Kim et al.; "Effect of ferromagnetic contacts on spin accumulation in an all-metallic lateral spin-valve system: Semiclassical spin drift-diffusion equations;" Physical Review B; 2008; pp. 214427-1-214427-12; vol. 78.

Tomoaki Inokuchi et al., "Electrical Spin Injection into n-GaAs Channels and Detection through MgO/CoFeB Electrodes", Applied Physics Express, Japan, vol. 2, Feb. 13, 2009, p. 023006-1-p. 023006-3.

Igor Zutic, et al., "Proposal for all—electrical measurement of T1 in semiconductors", Applied Physics Letters, US, vol. 82, No. 2, Jan. 13, 2003, p. 221-p. 223.

B. C. Min et al, "Cobalt—$Al_2O_3$—silicon tunnel contacts for electrical spin injection into silicon", Journal of Applied Physics, US. vol. 99, Apr. 26, 2006, p. 08S701-1-p. 08S701-3.

\* cited by examiner

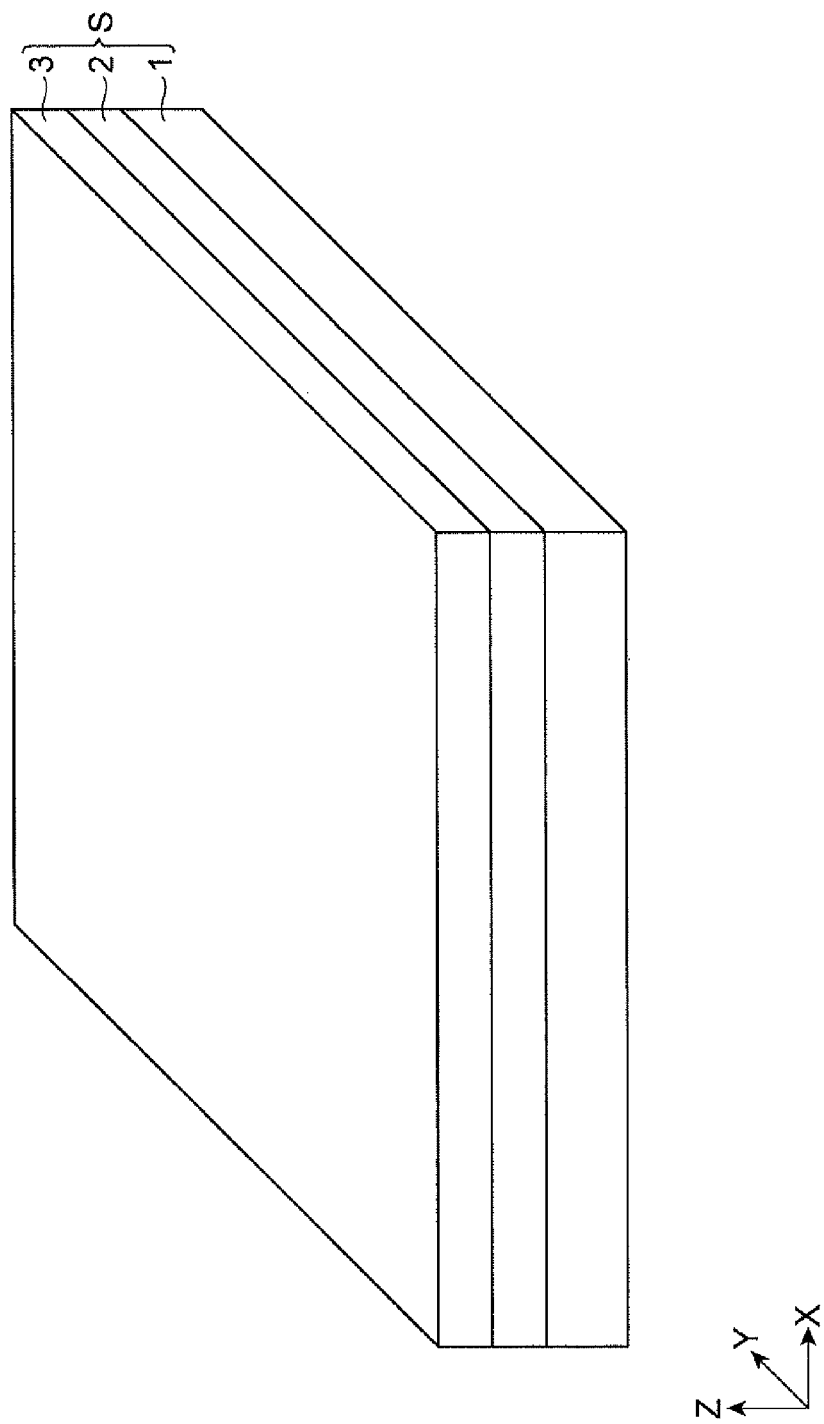

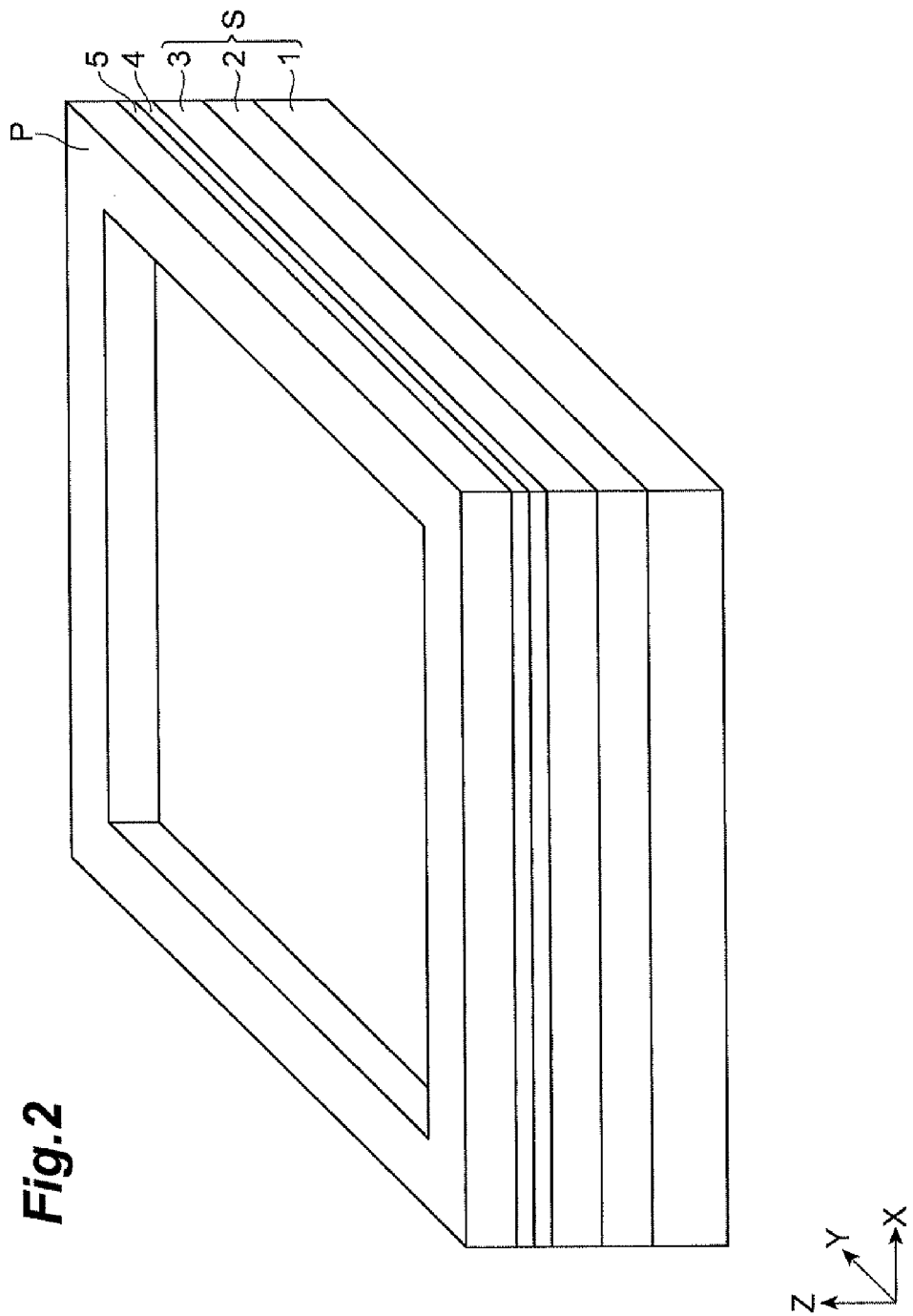

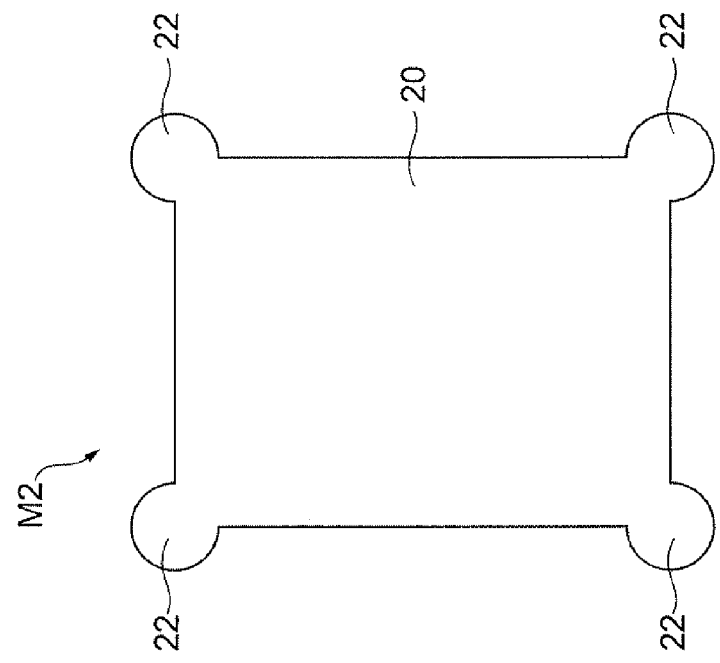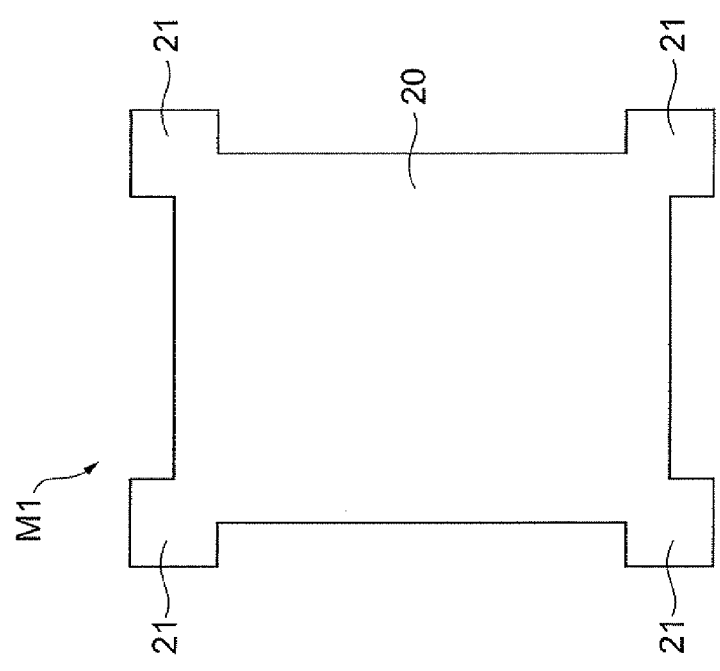

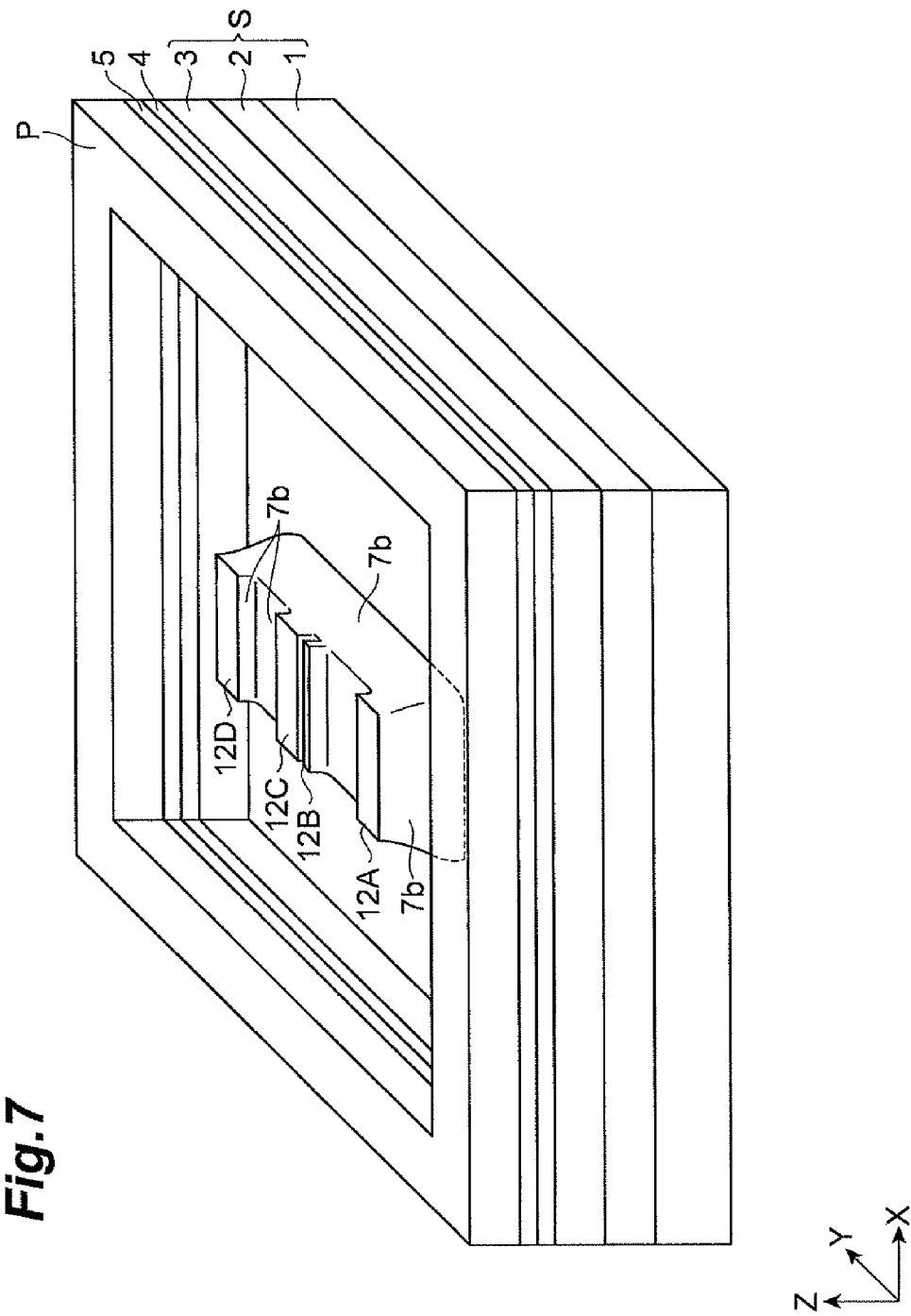

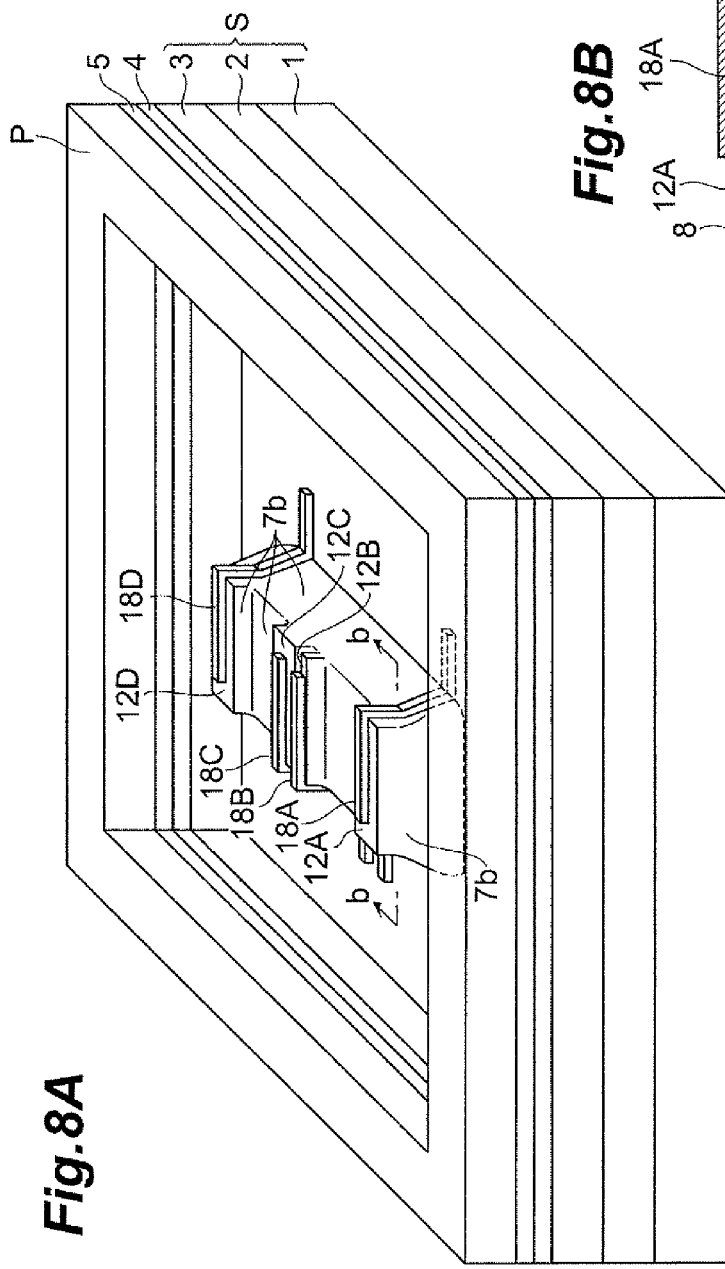
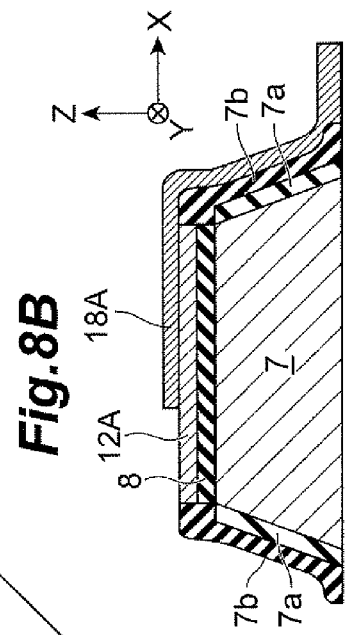

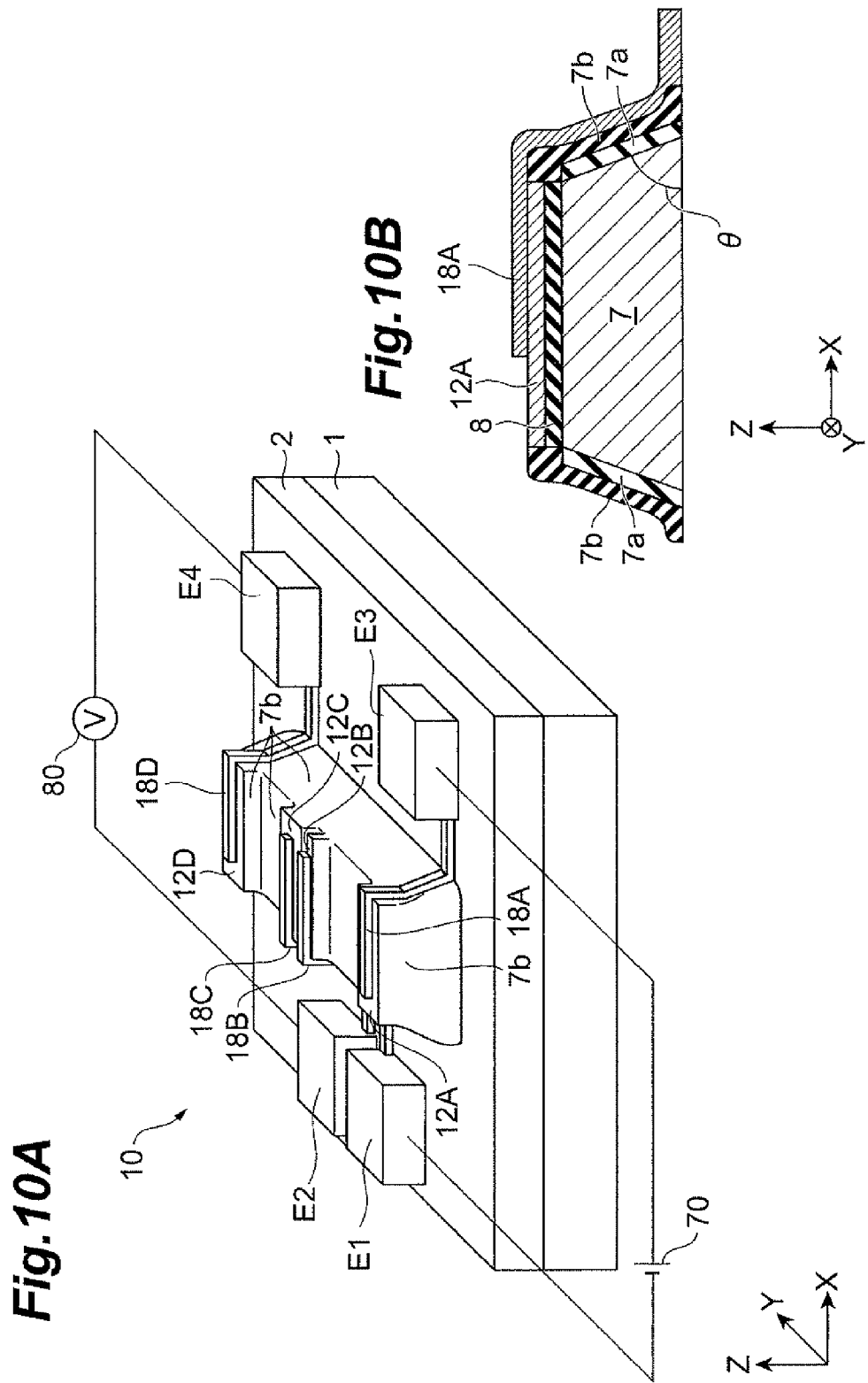

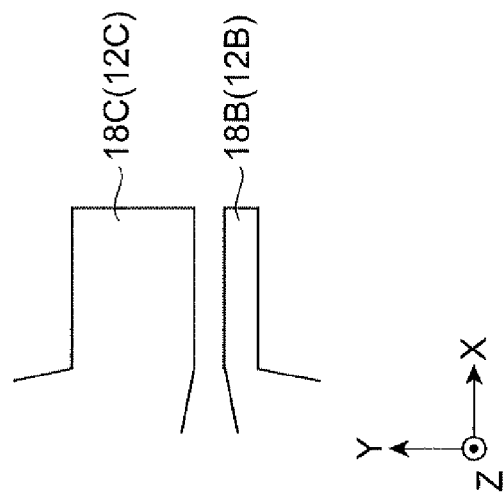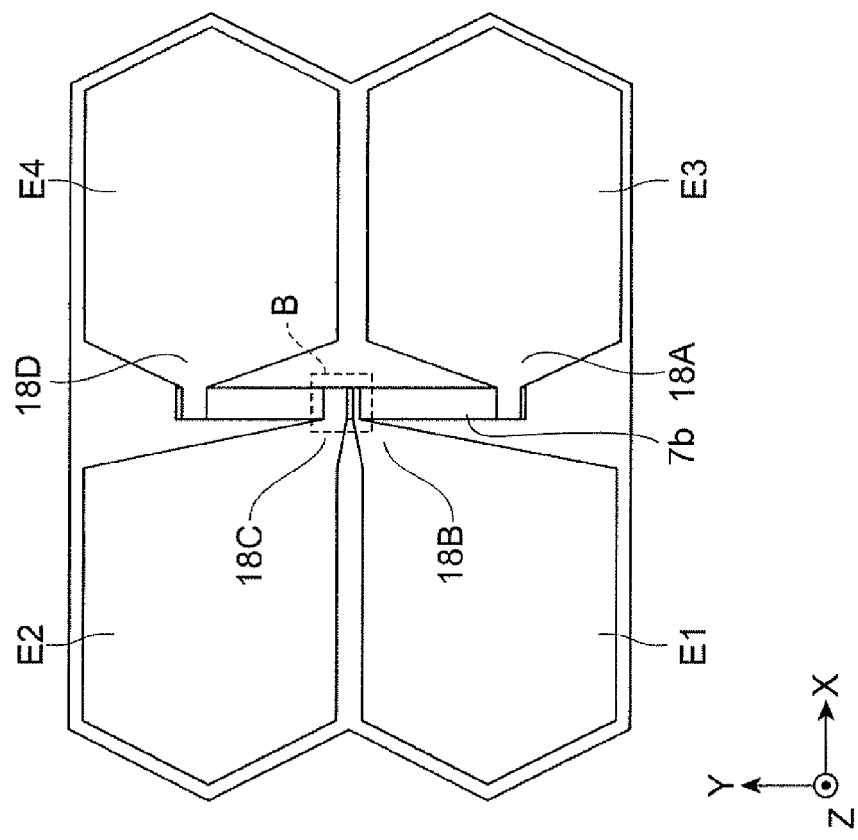

MANUFACTURING METHOD OF SILICON
SPIN TRANSPORT DEVICE AND SILICON
SPIN TRANSPORT DEVICE

BACKGROUND OF THE INVENTION

1. Field of the Invention

The present invention relates to a silicon spin transport device manufacturing method and a silicon spin transport device.

2. Related Background Art

Spin transport devices are known comprising a magnetization free layer and a magnetization fixed layer on a channel layer for accumulating or transporting spin. In recent years, much attention has focused on spin transport devices using semiconductor materials for the channel layer in place of spin transport devices using metal materials for the channel layer. This is because semiconductor materials have longer spin diffusion lengths than metal materials, opening up the possibility that passive devices such as GMR (giant magnetoresistive) devices and TMR (tunnel magnetoresistive) devices could be used as active devices. Moreover, in the case of a spin transport device using a semiconductor material the device can be simplified because a ferromagnetic metal material is used for the semiconductor electrode.

Known spin transport devices using semiconductor materials include those described in Japanese Patent Application Laid-open No. 2004-186274 and Japanese Patent Publication No. 4029772 for example.

Japanese Patent Application Laid-open No. 2004-186274 discloses the use of a semiconductor for the channel layer. Japanese Patent Publication No. 4029772 discloses the use of a GaAs based semiconductor compound for the channel layer.

SUMMARY OF THE INVENTION

However, it has been difficult to obtain sufficient voltage output with conventional spin transport devices. It is therefore an object of the present invention to provide a silicon spin transport device manufacturing method and a silicon spin transport device whereby the voltage output characteristics can be improved.

To attain this object, the silicon spin transport device manufacturing method of the present invention comprises a first step of patterning a silicon film by wet etching to thereby form a silicon channel layer, and a second step of forming a magnetization free layer and a magnetization fixed layer which are apart from each other on the silicon channel layer.

The inventors in this case arrived at the present invention upon discovering from their researches that when the a silicon channel layer is patterned by wet etching, the voltage output is unexpectedly much better than when it is patterned by a physical method such as ion milling. The reason why voltage output is improved when the silicon channel layer is patterned by wet etching is not known, but may be as follows. It is thought that the physical methods that have been used in the past are likely to cause damage to the silicon channel layer, adversely affecting the crystallinity the silicon channel layer. When this happens, there may be more scattering of spin in the silicon channel layer, resulting in less voltage output. It may also be that more spin scattering occurs in the silicon channel layer and the voltage output is reduced due to changes in the charge condition near the surface of the silicon film caused by ions that are driven into the silicon film during ion milling. By contrast, it appears that patterning by wet etching causes little physical damage to the silicon channel layer, and the crystal structure of the silicon channel layer can be maintained at a high level. Thus, spin scattering is controlled and a high voltage output can be obtained.

In the first step, an inclined part is preferably formed on a side surface of the silicon channel layer by anisotropic wet etching. With anisotropic wet etching it is possible to selectively etch in a specific crystal orientation to thereby provide a silicon channel layer having the desired form.

In the first step, it is desirable to use a mask including a main part and corner parts protruding from the main part. When patterning a silicon film by wet etching, the corners of the silicon film are corroded more easily than the main part. The degree of corrosion of the corner parts and main part of the silicon film can be adjusted by using a mask with protruding corner parts. This allows the silicon channel layer to be formed with precision.

In the first step, it is desirable to use a mask in which the corner parts have a smaller area than the main part. In this way it is possible to precisely mold a silicon channel layer in which the silicon film has a shape corresponding to the shape of the main part of the mask.

It is also desirable to use a mask in which the shape of the corner parts including the part shared with the main part is square, rectangular or circular. This allows the corrosion of the corner parts by wet etching to be more uniform than it would be if the protruding corner parts of the mask were irregularly shaped or distorted. Consequently, the silicon channel layer can be molded in the desired shape with even more precision in accordance with the shape of the main part of the mask.

A further step of forming a ferromagnetic layer by using ion milling to pattern a ferromagnetic film provided on the silicon film is preferably included before the first step. This makes it easier to pattern the silicon film by wet etching.

A further step of forming a ferromagnetic layer and an insulating layer by using ion milling to pattern a ferromagnetic film and an insulating film provided on the silicon film is preferably included before the first step. This makes it easier to pattern the silicon film by wet etching. Conductivity mismatch due to differences between the conductivities of the silicon making up the silicon channel layer and the materials making up the magnetization free layer and the magnetization fixed layer is also mitigated by means of the insulating layer. This serves to control spin scattering at the boundary between the silicon channel layer and the magnetization fixed layer or magnetization free layer. It is thus possible to further improve the voltage output characteristics of the silicon spin transport device.

The silicon spin transport device of the present invention is provided with a silicon channel layer, a magnetization free layer provided on a first part of the silicon channel layer, and a magnetization fixed layer provided on a second part of the silicon channel layer, with the silicon channel layer being formed by wet etching.

It is thought that by forming the silicon channel layer by wet etching it is possible to reduce physical damage to the silicon channel layer and maintain the crystal structure of the silicon channel layer at a high level. With such formation, it is assumed that the spin scattering can be controlled and a higher voltage output can be obtained.

The silicon channel layer preferably has an inclined part on a side surface. Breakage of wiring and the like formed on the silicon channel layer can be controlled if the side surface of the silicon channel layer is inclined. This makes it possible to obtain a highly reliable silicon spin transport device.

The angle of incline of the inclined part is preferably 50 to 60 degrees. If the angle of incline exceeds 60 degrees, breakage of wiring and other coated films becomes more likely. On the other hand, an angle of incline of less than 50 degrees is less efficient in terms of spin transport because the silicon channel layer becomes be too wide relative to the magnetization fixed layer and magnetization free layer.

Oxide films are preferably provided on the inclined part of the silicon channel layer, a side surface of the magnetization free layer, and a side surface of the magnetization fixed layer. Wiring is less likely to absorb spin from the silicon channel layer if the wiring is provided on top of such an oxide film. Providing wiring on top of these oxide films also prevents current from flowing from the wiring to the silicon channel layer, and spin injection efficiency is improved as a result.

An insulating layer is preferably provided between the silicon channel layer and the magnetization free layer and magnetization fixed layer. Conductivity mismatch due to differences between the conductivities of the silicon making up the silicon channel layer and the materials making up the magnetization free layer and magnetization fixed layer is mitigated by means of this insulating layer. As a result, spin scattering is suppressed at the boundaries between the silicon channel layer and the magnetization fixed layer or magnetization free layer. The voltage output characteristics of the silicon spin transport device can be improved as a result. Also, the insulating layer is preferably made of MgO.

It is desirable to provide an electrode between the first part and the second part on the silicon channel layer. This allows an electric field or magnetic field to be applied by the electrode to the spin flow or electric current flowing between the magnetization free layer and magnetization fixed layer. It is thus possible to adjust the polarization direction of the spin.

The materials of the magnetization free layer and magnetization fixed layer are preferably metals selected from the group consisting of Ti, V, Cr, Mn, Co, Fe and Ni, alloys containing one or more of the elements in this group, or alloys containing one or more elements selected from this group and one or more elements selected from the group consisting of B, C and N. Because these materials are soft magnetic materials, the functions of the magnetization free layer can be favorably achieved. It is also possible to favorably achieve the functions of the magnetization fixed layer because these materials are ferromagnetic materials with strong spin polarizability.

A coercivity difference is preferably conferred on the magnetization free layer and magnetization fixed layer by means of shape anisotropy. This eliminates the need for an antiferromagnetic layer to provide the coercivity difference.

The coercivity of the magnetization fixed layer is preferably greater than that of the magnetization free layer. This allows the functions of the magnetization fixed layer and magnetization free layer to be achieved favorably in the silicon spin transport device.

An antiferromagnetic layer is preferably formed on the magnetization fixed layer, and this antiferromagnetic layer fixes the direction of magnetization of the magnetization fixed layer. Unidirectional anisotropy in the direction of magnetization of the magnetization fixed layer is obtained by means of exchange coupling between the antiferromagnetic layer and the magnetization fixed layer. It is thus possible to obtain a magnetization fixed layer having greater coercivity in one direction than without an antiferromagnetic layer.

The present invention provides a silicon spin transport device manufacturing method and silicon spin transport device whereby the voltage output characteristics are improved.

BRIEF DESCRIPTION OF THE DRAWINGS

FIG. 1 is an oblique view of an SOI substrate;
FIG. 2 is an oblique view showing an insulating film, a ferromagnetic film, and an alignment pattern prepared on the SOI substrate;
FIGS. 3A and 3B are a top view of a mask for use in patterning a silicon film;
FIG. 7 is an oblique view with a formed oxide film;
FIG. 8A is an oblique view with formed wiring,
and FIG. 8B is a cross-section along the b-b line in FIG. 8A;
FIG. 10A is an oblique viewing showing a silicon spin transport device of the present invention,
and FIG. 10B shows the XZ cross-section of the silicon channel layer of FIG. 10A;
FIG. 11A is a top view of a silicon spin transport device of the present invention,
and FIG. 11B shows an expanded view of region B in FIG. 11A.

DESCRIPTION OF THE PREFERRED EMBODIMENTS

Figure 4:
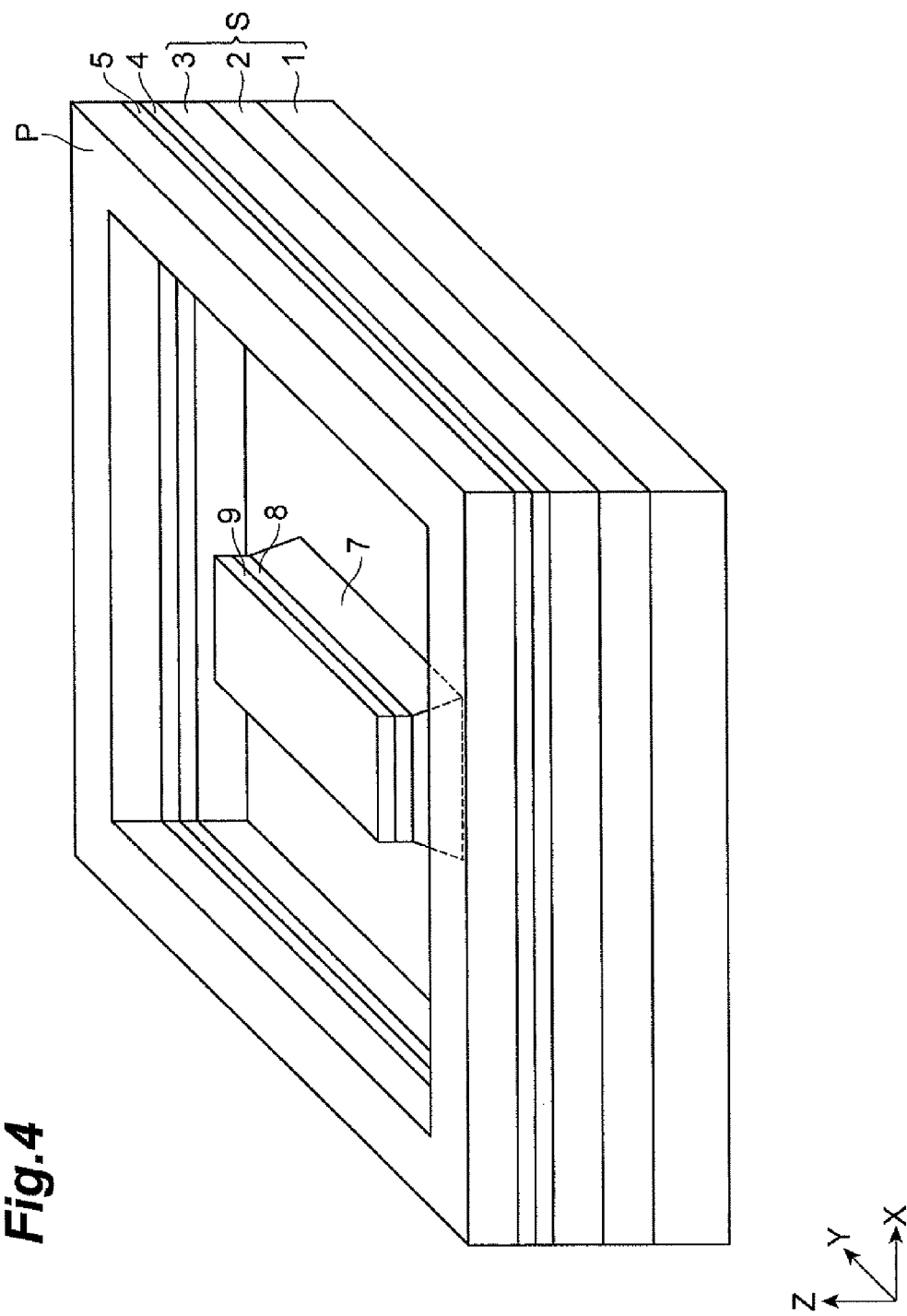
FIG. 4 is an oblique view showing patterning of a silicon film, an insulating film and a ferromagnetic film.

Embodiments of the present invention are explained in detail below with reference to the attached drawings. The same elements are indicated by the same symbols in the drawings, and redundant explanations have been omitted.

The silicon spin transport device manufacturing method of the present invention is explained here. First, as shown in FIG. 1, SOI (Silicon On Insulator) substrate S is prepared comprising silicon substrate 1, silicon oxide film 2 and silicon film 3 with surface (100) formed in that order.

Ions for conferring electrical conductivity are injected into silicon film 3, after which annealing is performed to scatter the ions. Examples of ions for conferring conductivity include B and P ions. The annealing temperature can be 900° C. for example.

Next, adhering matter, organic matter and oxide film are removed by washing from the surface of SOI substrate S. Acetone, isopropyl alcohol and dilute HF (Hydrofluoric acid) for example can be used for the washing liquid.

After SOI substrate S has been washed, insulating film 4 and ferromagnetic film 5 are formed on silicon film 3 of SOI substrate S as shown in FIG. 2. Insulating film 4 and ferromagnetic film 5 can be formed for example by MBE (Molecular Beam Epitaxy). Adhering matter, organic matter and oxide film are then removed from the surface of ferromagnetic film 5 by washing. Acetone or isopropyl alcohol for example can be used as the washing liquid.

After ferromagnetic film 5 has been washed, alignment pattern P is prepared on ferromagnetic film 5 as shown in FIG. 2. Alignment pattern P is prepared by photolithography. A 100 nm Ta film for example can be used as alignment pattern P.

Next, a mask is formed by photolithography on ferromagnetic film 5. Examples of mask shapes are shown in FIGS. 3A and 3B. As shown in FIGS. 3A and 3B, main part 20 and masks M1 and M2 having corner parts 21 and 22 protruding from main part 20 are used. In this case, it is best to use a mask in which the area of corner parts 21 and 22 is smaller than the area of main part 20. If main part 20 is rectangular for example, protruding corner parts 21 and 22 are disposed at the four corners of the rectangle.

Corner parts 21 of mask M1 can be square including the part shared with main part 20 of mask M1 as shown in FIG. 3A. Corner parts 22 of mask M2 can also be circular including the part shared with main part 20 of mask M2 as shown in FIG. 3B. It is also possible for the corner parts of the mask to be rectangular or triangular for example including the part shared with the main part of the mask. The invention can also be implemented using a mask with no corner parts.

After Ta film formation, insulating film 4 and ferromagnetic film 5 are patterned by ion milling with a resist using mask M1 or M2 as described above to obtain insulating layer 8 and ferromagnetic layer 9. Next, a Ta film and resist are formed on ferromagnetic layer 9. Silicon film 3 is then patterned by wet etching using insulating layer 8, ferromagnetic layer 9, the Ta film and the resist as a mask to thereby obtain the silicon channel layer 7 shown in FIG. 4 (first step). Anisotropic wet etching can be used as the wet etching method. A tetramethylammonium hydroxide (TMAH) aqueous solution or potassium hydroxide (KOH) aqueous solution for example can be used as the wet etching liquid. After wet etching the resist is removed. Also, after wet etching the Ta film is either removed or integrated with the wiring described below.

Figure 5:
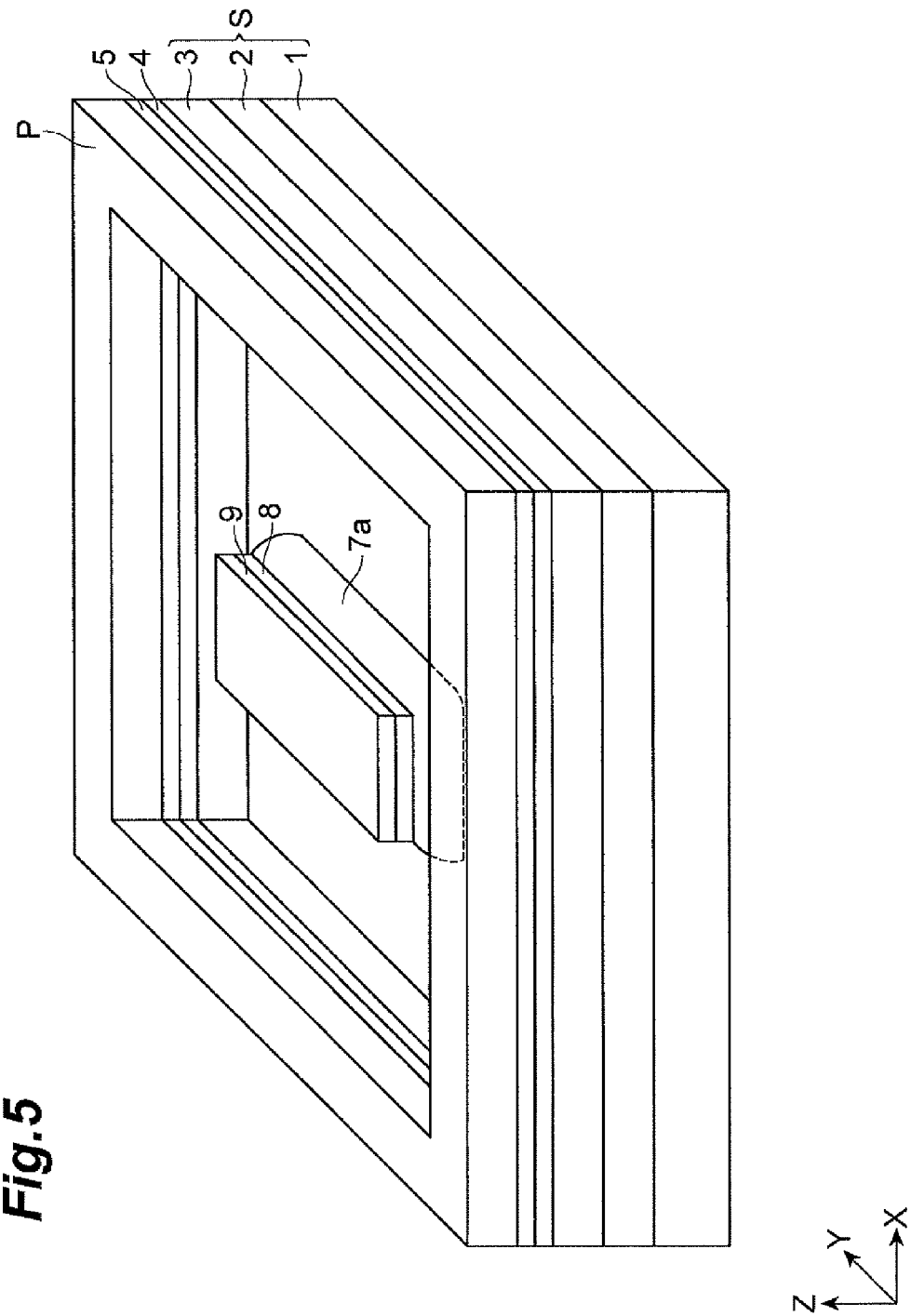
FIG. 5 is an oblique view with a formed oxide film.

A silicon channel layer 7 of the desired shape can be obtained by using mask M1 or M2 having corner parts 21 or 22 protruding from main part 20. When anisotropic wet etching is used, an inclined part is formed on the side surface of silicon channel layer 7. Using wet etching, the inclined surface becomes surface (111), which is at an angle of approximately 55 degrees to silicon substrate 1. In the example of FIG. 4, a rectangular mask has been used for the main part, forming rectangular silicon channel layer 7 in which the Y direction is the longitudinal direction. Because in this state the inclined part of silicon channel layer 7 is exposed, the side of silicon channel layer 7 oxidizes naturally, forming oxide film 7a. Alternatively, oxide film 7a can be formed be oxygen annealing on the side surface of silicon channel layer 7. FIG. 5 shows oxide film 7a formed on the side of silicon channel layer 7.

Figure 6:
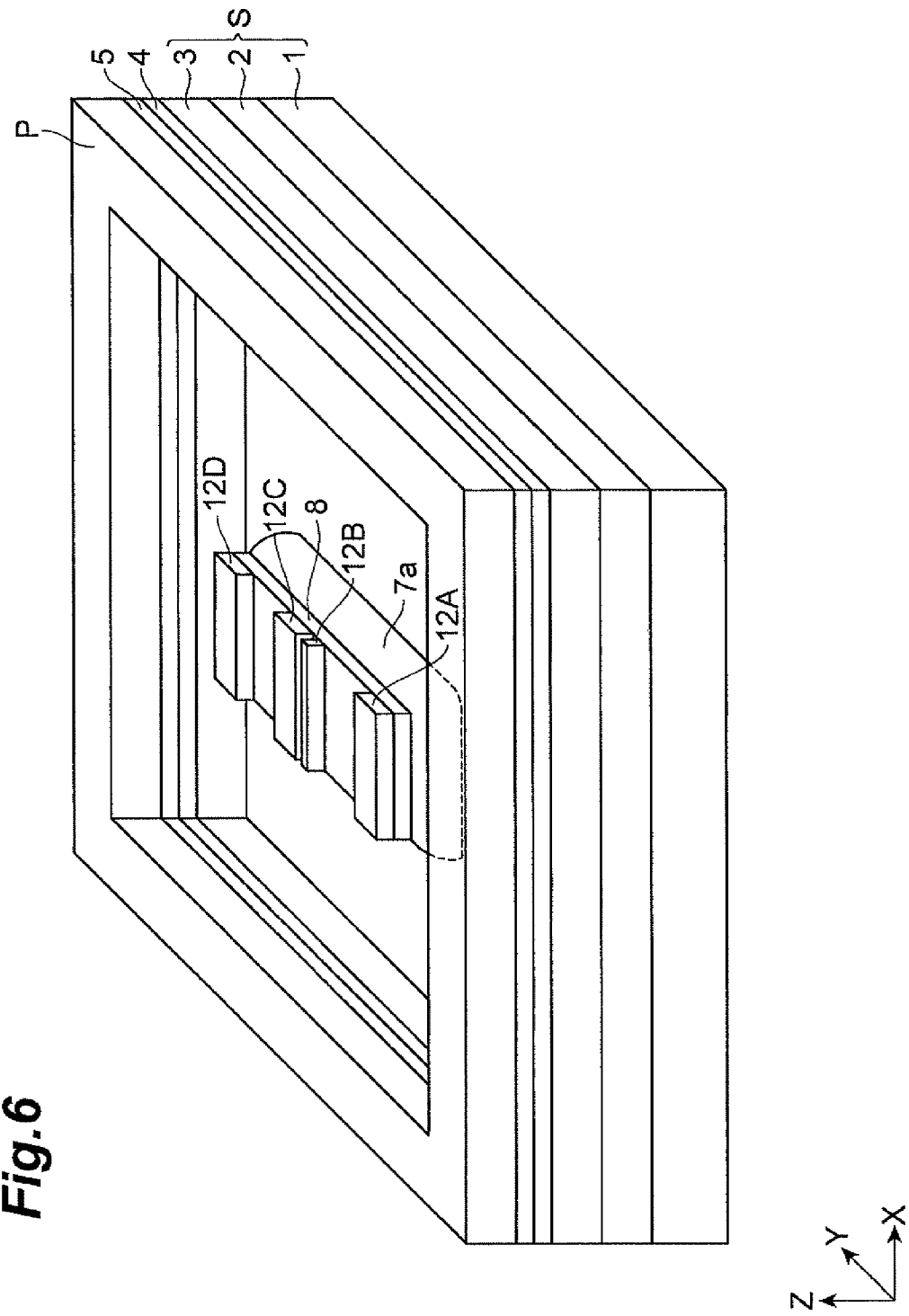
FIG. 6 is an oblique view showing a ferromagnetic film formed into fine lines after patterning.

Next, the oxide film on the surface of ferromagnetic layer 9 is first removed by ion milling, and ferromagnetic layer 9 is patterned by etching to form magnetization fixed layer side electrode 12A, magnetization fixed layer 12B, magnetization free layer 12C and magnetization free layer side electrode 12D as shown in FIG. 6. In this case, magnetization fixed layer side electrode 12A, magnetization fixed layer 12B, magnetization free layer 12C and magnetization free layer side electrode 12D are arranged in the longitudinal direction or in other words the Y direction on insulating layer 8. If a nonmagnetic metal such as Al that has low resistance with respect to Si is used for magnetization fixed layer side electrode 12A, it is not necessary to provide an insulating layer 8 between magnetization fixed layer side electrode 12A and silicon channel layer 7. If a nonmagnetic metal such as Al that has low resistance with respect to Si is used for magnetization free layer side electrode 12D, it is not necessary to provide an insulating layer 8 between magnetization free layer side electrode 12D and silicon channel layer 7. In this way, magnetization free layer 12C and magnetization fixed layer 12B are formed apart from each other on silicon channel layer 7 (second step). In this step, magnetization free layer 12C is formed with a width greater than that of magnetization fixed layer 12B in the Y direction. This kind of patterning is accomplished by removing the unneeded portions of insulating layer 8 and ferromagnetic layer 9 by ion milling and chemical etching for example.

Next, as shown in FIG. 7, oxide film 7b, such as a silicon oxide film and the like, is preferably formed by sputtering or the like for example on surfaces of magnetization fixed layer side electrode 12A, magnetization fixed layer 12B, magnetization free layer 12C and magnetization free layer side electrode 12D, but on the upper surfaces thereof. That is, oxide film 7b is formed on the side surfaces of oxide film 7a, insulating film 8, magnetization fixed layer side electrode 12A, magnetization fixed layer 12B, magnetization free layer 12C and magnetization free layer side electrode 12D.

As shown in FIG. 8A, wiring 18A is formed on top of magnetization fixed layer side electrode 12A and on the inclined side surface of silicon channel layer 7. Wiring 18B is formed on top of magnetization fixed layer 12B and on the inclined side surface of silicon channel layer 7. Wiring 18C is formed on top of magnetization free layer 12C and on the inclined side surface of silicon channel layer 7. Wiring 18D is formed on top of magnetization free layer side electrode 12D and on the inclined side surface of silicon channel layer 7. Wirings 18A through 18D are formed by photolithography for example.

FIG. 8B is a cross-section along the b-b line in FIG. 8A. By disposing the wiring on this oxide film 7b, it is possible to prevent the wiring from absorbing the spin of silicon channel layer 7. Because the wiring is normally more a conductor than a semiconductor, it has a short spin diffusion length, and will absorb spin if it comes into direct contact with silicon channel layer 7. Moreover, magnetization fixed layer 12B is a ferromagnetic layer which should normally inject spin into silicon channel layer 7, but the spin injection efficiency will be very bad if current flows from the conductive wiring into silicon channel layer 7.

Figure 9:
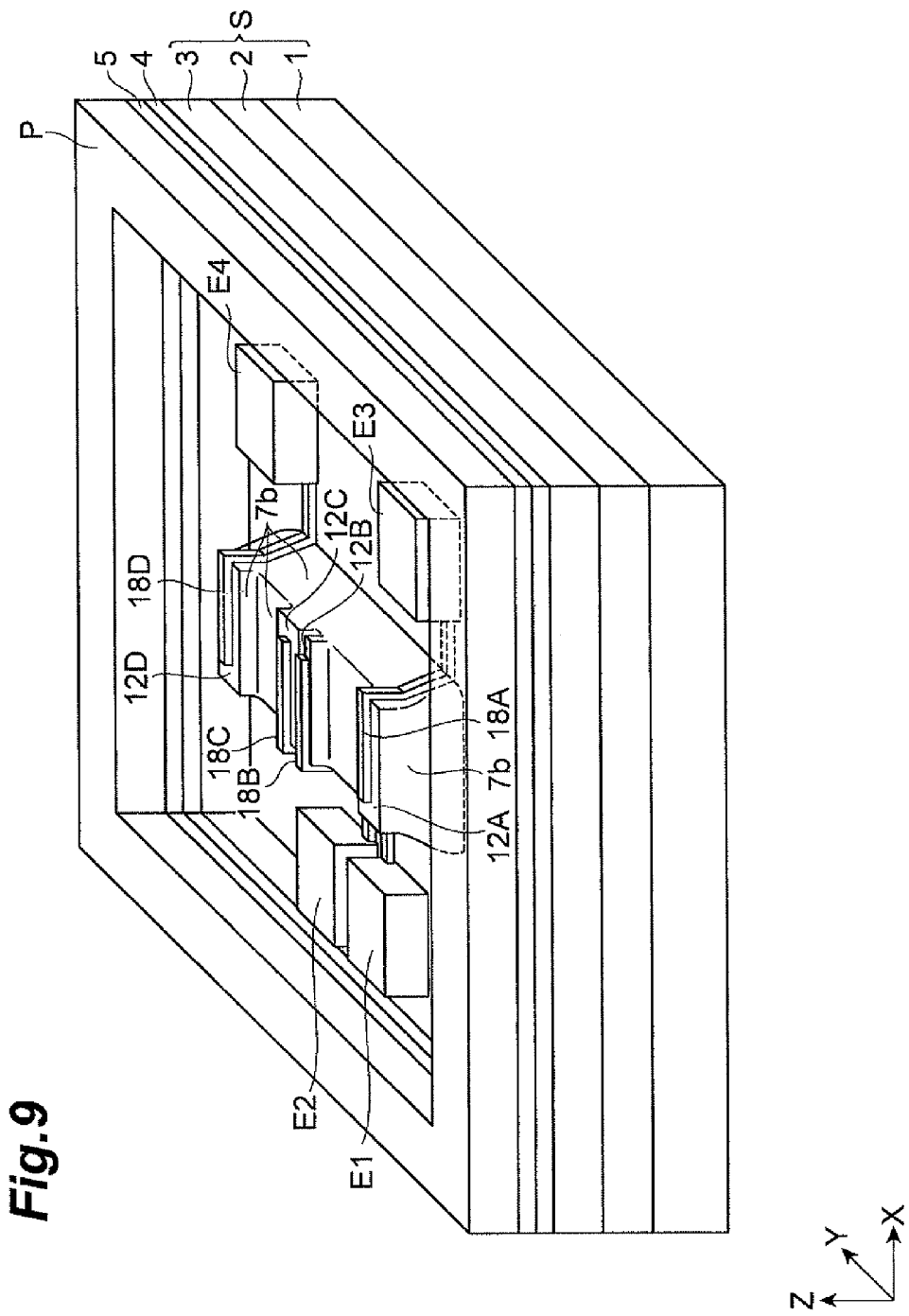
FIG. 9 is an oblique view with a formed electrode pad.

Next, as shown in FIG. 9, measurement electrode pads E1 through E4 are formed on the end portions of wires 18A through 18D, respectively. The end portions of wires 18A through 18D and measurement electrode pads E1 through E4 are formed on silicon oxide film 2, which has been exposed by wet etching, and on oxide film 7b. Finally, the desired silicon spin transport device is obtained by chipping.

FIG. 10A is an oblique view of a chipped silicon spin transport device 10. FIG. 10B is an XZ cross-section of silicon channel layer 7 in FIG. 10A. FIG. 11A is a top view of a silicon spin transport device. FIG. 11B shows an expanded view of region B in FIG. 11A.

As shown in FIG. 10A, silicon spin transport device 10 comprises silicon oxide film 2 provided on silicon substrate 1, silicon channel layer 7 on silicon oxide film 2, magnetization free layer 12C on a first part of silicon channel layer 7, and magnetization fixed layer 12B on a second part of silicon channel layer 7 different from the first part. Silicon channel layer 7 has been formed by wet etching.

Silicon spin transport device 10 also comprises magnetization fixed layer side electrode 12A on a third part of silicon channel layer 7 and magnetization free layer side electrode 12D on a fourth part of silicon channel layer 7. Insulating layer 8 is provided between silicon channel layer 7 and magnetization fixed layer side electrode 12A, magnetization fixed layer 12B, magnetization free layer 12C and magnetization free layer side electrode 12D. Alternatively, insulating layer 8 is not provided if a non-magnetic metal such as Al having low resistance with respect to Si is used for magnetization fixed layer side electrode 12A and magnetization free layer side electrode 12D.

As shown in FIG. 10B, silicon channel layer 7 has an inclined part on the side, and the angle of inclination θ of this part is 50 to 60 degrees. Angle of inclination θ is the angle formed by the bottom and side of silicon channel layer 7.

As shown in FIG. 10A, wiring 18A is provided on top of magnetization fixed layer side electrode 12A and on the inclined side surface of silicon channel layer 7. Wiring 18B is provided on top of magnetization fixed layer 12B and on the inclined side surface of silicon channel layer 7. Wiring 18C is provided on top of magnetization free layer 12C and on the inclined side surface of silicon channel layer 7. Wiring 18D is provided on top of magnetization free layer side electrode 12D and on the inclined side surface of silicon channel layer 7. Measurement electrode pads E1 through E4 are provided at the ends of wires 18A through 18D, respectively. The end portions of wires 18A through 18D and measurement electrode pads E1 through E4 are formed on silicon oxide film 2.

As shown in FIG. 11A, silicon channel layer 7 has a cuboid shape with the Y direction as the longitudinal axis. As shown in FIG. 11B, magnetization fixed layer 12B is provided below wiring 18B. Magnetization free layer 12C is provided below wiring 18C. Magnetization fixed layer 12B and magnetization free layer 12C have cuboid shapes with the X direction as the longitudinal axis. The width of magnetization free layer 12C in the Y direction is greater than that of magnetization fixed layer 12B. There is a difference in switching fields between magnetization fixed layer 12B and magnetization free layer 12C due to the difference in aspect ratio in the X and Y directions. This creates a coercivity difference between magnetization fixed layer 12B and magnetization free layer 12C due to shape anisotrophy, with magnetization fixed layer 12B having greater coercivity than magnetization free layer 12C.

The materials of magnetization fixed layer 12B and magnetization free layer 12C are metals selected from the group consisting of Ti, V, Cr, Mn, Co, Fe and Ni, alloys containing one or more of the elements in this group, or alloys containing one or more elements selected this group and one or more elements selected from the group consisting of B, C and N. Magnetization fixed layer 12B and magnetization free layer 12C may also be laminates of these metals and alloys. For example, laminate films of Fe and Ti can be used for magnetization fixed layer 12B and magnetization free layer 12C.

Insulating layer 8 is made of an insulating material such as MgO. Wires 18A through 18D are made of an electrically conductive material such as Cu. Electrode pads E1 through E4 are made of an electrically conductive material such as Au.

Silicon spin transport device 10 can be obtained in this way. In the resulting silicon spin transport device 10, as shown in FIG. 10A, current for detection can be supplied to magnetization fixed layer 12B by connecting electrode pads E1 and E3 to current source 70. When current for detection flows to non-magnetic silicon channel layer 7 from ferromagnetic magnetization fixed layer 12B, electrons having spin corresponding to the direction of magnetization of magnetization fixed layer 12B are injected into silicon channel layer 7. The injected spin diffuses towards magnetization free layer 12C. In this way, the flow of electric current and spin into silicon channel layer 7 can be directed mainly in the Y direction. Voltage output is generated at the boundary between silicon channel layer 7 and magnetization free layer 12C by means of interactions between the direction of magnetization of magnetization free layer 12C or in other words electron spin, which is altered by external magnetic fields, and the electron spin of the part of silicon channel layer 7 that contacts magnetization free layer 12C. This voltage output can be detected by voltage measurement device 80, which is connected to electrode pads E2 and E4.

In the silicon spin transport device 10 of the present invention, it appears that since the silicon film is patterned by wet etching there is little physical damage to the silicon channel layer, and the crystal structural of the silicon channel layer is maintained at a high level. Spin scattering is thus controlled, resulting in a high voltage output.

The present invention is explained in more detail below based on examples and comparative examples, but the present invention is not limited by the following examples.

Example

An SOI substrate was prepared including a silicon substrate, a silicon oxide film (200 nm thick) and a silicon film (100 nm thick). First, ions for conferring electrical conductivity were injected into the silicon film, and these ions were diffused by annealing. The annealing temperature was 900° C. Next, adhering matter, organic matter and oxide film on the surface of the silicon film of the SOI substrate were removed by washing. HF was used as the washing liquid.

Next, a laminate of MgO film (0.8 nm thick), Fe film (10 nm thick), Ti film (5 nm thick) and Ta film (3 nm thick) was formed on the silicon film. The Ta film was then washed with acetone and isopropyl alcohol. A silicon channel layer with an inclined side surface was then obtained by anisotropic wet etching. The silicon channel layer in this case was 23 μm by 300 μm in size. The angle of inclination θ of the inclined side surface of the resulting silicon channel layer was 55 degrees. TMAH was used as the etching liquid.

This was then patterned by ion milling and chemical etching to obtain a magnetization fixed layer side electrode, magnetization fixed layer, magnetization free layer and magnetization free layer side electrode including laminated Fe and Ti layers.

Next, wiring was formed on each of the magnetization fixed layer side electrode, magnetization fixed layer, magnetization free layer and magnetization free layer side electrode. A laminated structure of Ta (10 nm thick), Cu (50 nm thick) and Ta (10 nm thick) was used for the wiring. Electrode pads were then formed at the end portions of each of the wirings. A laminated structure of Cr (50 nm thick) and Au (150 nm thick) was used for the electrodes. In this way, the silicon spin transport device of the Example was obtained having a configuration similar to that of silicon spin transport device 10 in FIG. 10A.

Figure 12:
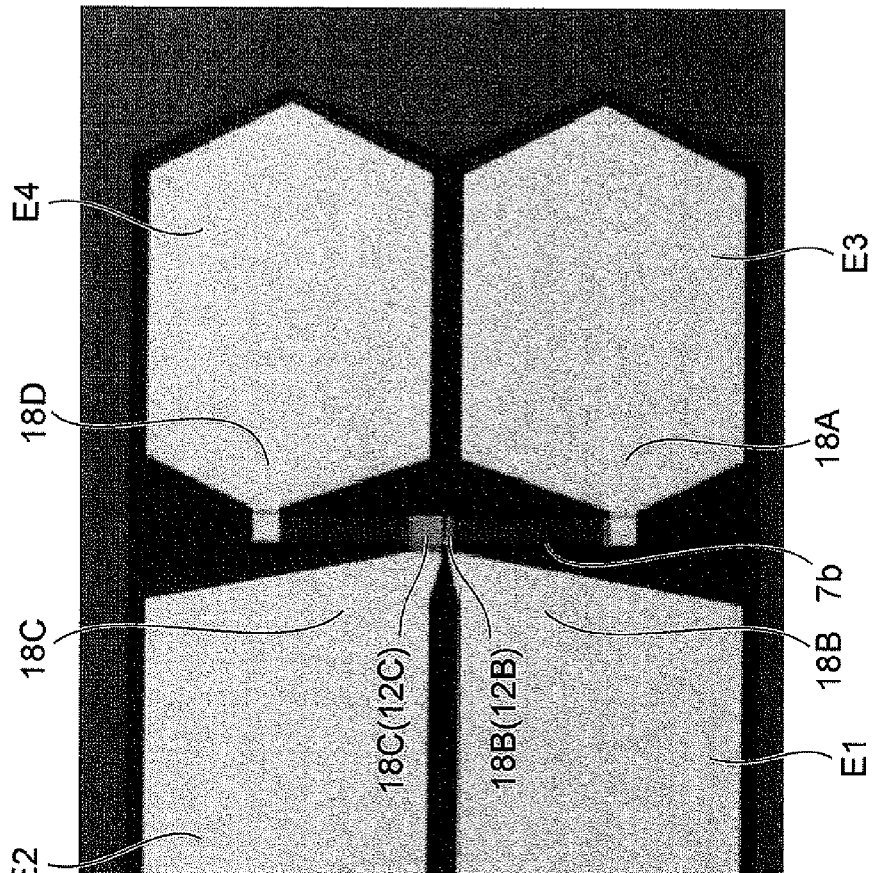
FIG. 12 is a top-view photograph of the silicon spin transport device of the Example.

FIG. 12 is a top-view photograph of the silicon spin transport device of the Example. As shown in FIG. 12, magnetization free layer 12C (under wiring 18C in FIG. 12) and magnetization fixed layer 12B (under wiring 18B in FIG. 12) are provided on silicon channel layer 7. Magnetization fixed layer 12B is connected to electrode pad E1 via wire 18B, while magnetization free layer 12C is connected to electrode pad E2 via wire 18C.

Comparative Example

In the Comparative Example, a silicon spin transport device was obtained by the same procedures as in the Example except that the silicon channel layer was formed by ion milling rather than by anisotropic wet etching.

(Evaluation of Output Voltage)

An external magnetic field was applied to the silicon spin transport devices prepared in the Example and Comparative Example, and the resulting output voltage was measured.

Specifically, spin was injected from the magnetization fixed layer into the silicon channel layer by supplying current for detection from a current source to the magnetization fixed layer. Voltage output based on magnetization changes in the magnetization free layer due to the external magnetic field were then measured with a voltage measurement device.

Figure 13B:
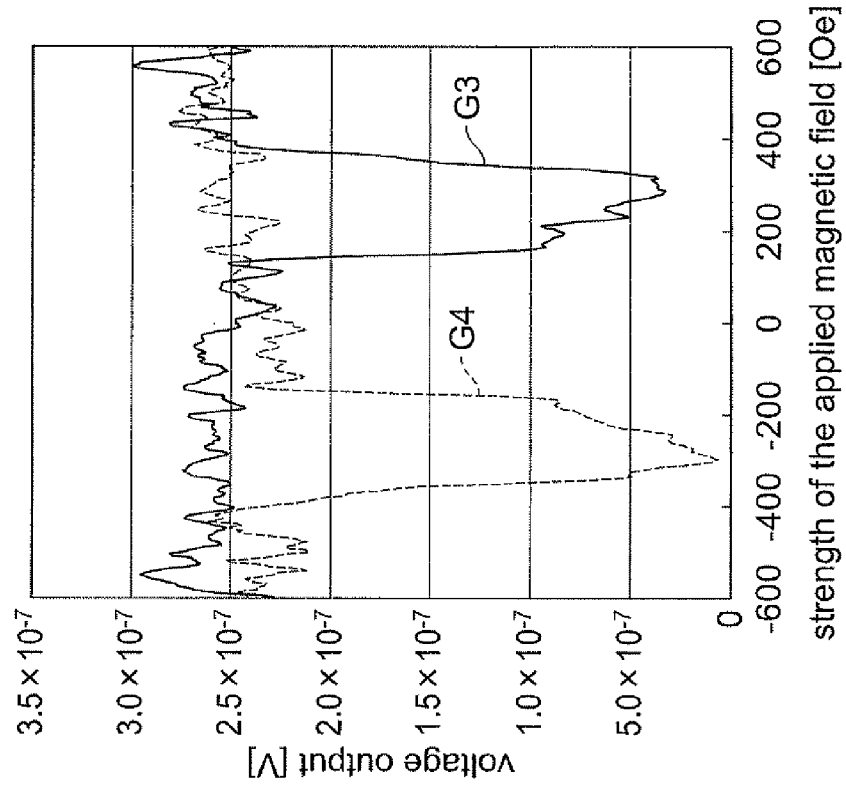
FIGS. 13A and 13B are graphs showing the relationship between strength of the applied magnetic field (Oe) and voltage output (V).
Figure 13A:
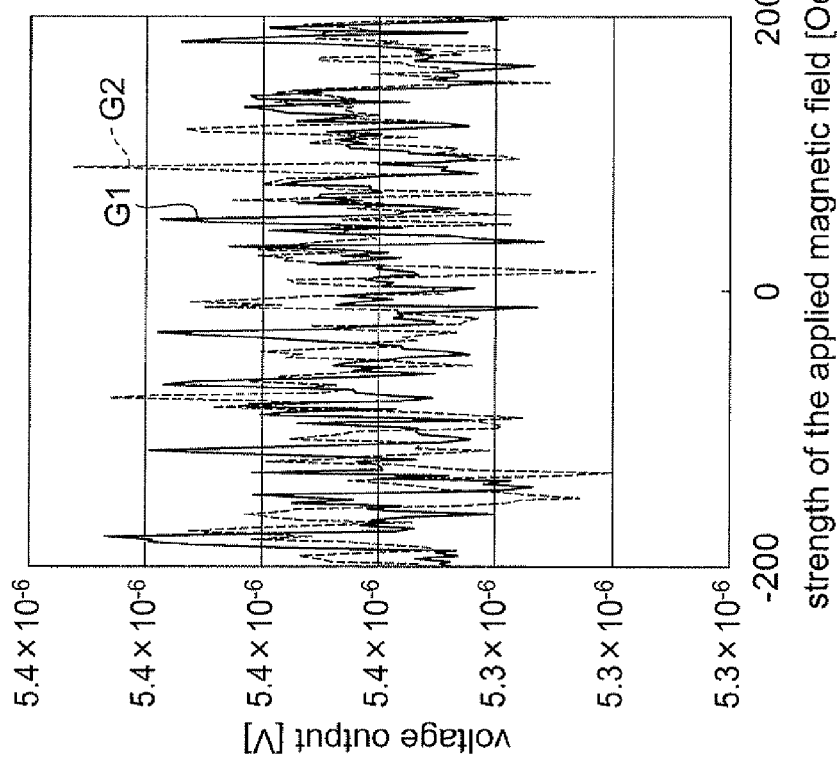

The results are shown in FIGS. 13A and 13B. FIGS. 13A and 13B are graphs showing the relationship between the strength of the applied magnetic field (Oe) and voltage output (V). FIG. 13A pertains to the silicon spin transport device of the Comparative Example, while FIG. 13B pertains to the silicon spin transport device of the Example. In FIGS. 13A and 13B, G1 and G3 show results with a gradually increasing applied magnetic field, while G2 and G4 show results with a gradually diminishing applied magnetic field.

In the case of the silicon spin transport device of the Comparative Example, as shown by G1 and G2 of FIG. 13A, there was no obvious peak in voltage output, indicating poor voltage output characteristics. This is probably due to spin scattering that occurred in the silicon channel layer itself because the crystallinity of the semiconductor material making up the silicon channel layer was damaged by plasma or the like.

By contrast, in the case of the silicon spin transport device of the Example a voltage output peak appears in conjunction with magnetization reversal near 300 (Oe) as the external magnetic field is gradually increased as shown by G3 in FIG. 13B. As shown by G4 in FIG. 13B, moreover, a voltage output peak appears in conjunction with magnetization reversal near −300 (Oe) as the external magnetic field is gradually decreased. Thus, the voltage output characteristics of the silicon spin transport device of the Example are better than those of the Comparative Example. This is attributed to good crystallinity of the silicon and reduced spin scattering because the silicon channel layer was formed by wet etching.

A preferred embodiment of the present invention was explained in detail above, but the present invention is not limited to this embodiment. The embodiment above pertains to an example in which silicon film 3 was patterned by wet etching after insulating film 4 and ferromagnetic film 5 had been patterned by ion milling on silicon film 3 in the first step. However, it is also possible to pattern only silicon film 3 by wet etching before forming insulating film 4 and ferromagnetic film 5 on silicon film 3. The insulating film and ferromagnetic film can then be formed on the patterned silicon film, and the insulating layer and ferromagnetic layer can be obtained by patterning.

It is also possible to provide only the insulating film on silicon film 3 and then pattern this insulating film by ion milling to obtain the insulating layer before patterning silicon film 3 by wet etching. The ferromagnetic film can then be formed and patterned on the already patterned silicon film and insulating film.

Another electrode can also be provided between magnetization fixed layer 12B and magnetization free layer 12C on silicon channel layer 7. An electric or magnetic field can then be applied from this electrode to the flow of spin or current between magnetization fixed layer 12B and magnetization free layer 12C. This allows the polarization direction of the spin to be adjusted.

An antiferromagnetic layer can also be provided on magnetization fixed layer 12B. The antiferromagnetic layer functions to fix the direction of magnetization of magnetization fixed layer 12B. Unidirectional anisotropy in the direction of magnetization of the magnetization fixed layer is obtained by means of exchange coupling between the antiferromagnetic layer and the magnetization fixed layer. It is thus possible to obtain a magnetization fixed layer having greater coercivity in one direction than without an antiferromagnetic layer. The material of the antiferromagnetic layer is selected in accordance with the material used for the magnetization fixed layer. For example, antiferromagnetic alloys using Mn such as alloys containing Mn and at least one element selected from Pt, Ir, Fe, Ru, Cr, Pd and Ni can be used for the antiferromagnetic layer. Specific examples include IrMn and PtMn.

What is claimed is:

1. A silicon spin transport device manufacturing method comprising:
    a first step of patterning a silicon film by wet etching to thereby form a silicon channel layer,
    a second step of forming a magnetization free layer and a magnetization fixed layer which are apart from each other on the silicon channel layer, and
    a step of forming a ferromagnetic layer by using ion milling to pattern a ferromagnetic film provided on the silicon film before the first step.

2. The silicon spin transport device manufacturing method according to claim 1, wherein:
    a mask including a main part and a corner part protruding from the main part is used in the first step.

3. The silicon spin transport device manufacturing method according to claim 2, the corner part having an area smaller than that of the main part.

4. The silicon spin transport device manufacturing method according to claim 3, the corner part including a part shared with the main part, and the shared part having a shape that is square, rectangular or circular.

5. A silicon spin transport device manufacturing method comprising:
    a first step of patterning a silicon film by wet etching to thereby form a silicon channel layer,
    a second step of forming a magnetization free layer and a magnetization fixed layer which are apart from each other on the silicon channel layer, and
    a step of forming a ferromagnetic layer and an insulating layer by using ion milling to pattern a ferromagnetic film and an insulating film provided on the silicon film before the first step.

6. A silicon spin transport device comprising a silicon channel layer, a magnetization free layer provided on a first part of the silicon channel layer, a magnetization fixed layer provided on a second part of the silicon channel layer and an insulating layer between the silicon channel layer and the magnetization free layer and magnetization fixed layer, wherein material of the insulating layer is MgO.

7. The silicon spin transport device according to claim 6, wherein the silicon channel layer has an inclined part on a side surface.

8. The silicon spin transport device according to claim 7, wherein the inclined part has an angle of inclination that is 50 to 60 degrees.

9. The silicon spin transport device according to claim 7, wherein oxide films are provided on the inclined part of the silicon channel layer, a side surface of the magnetization free layer and a side surface of the magnetization fixed layer.

10. The silicon spin transport device according to claim 6, wherein a coercivity difference is conferred on the magnetization free layer and magnetization fixed layer by means of shape anisotropy.

11. The silicon spin transport device according to claim 6, wherein a coercivity of the magnetization fixed layer is greater than that of the magnetization free layer.

12. The silicon spin transport device according to claim 6, further comprising an antiferromagnetic layer formed on the magnetization fixed layer, wherein the antiferromagnetic layer fixes the direction of magnetization of the magnetization fixed layer.

\* \* \* \* \*